United States Patent
Wu et al.

(10) Patent No.: US 11,749,958 B2
(45) Date of Patent: Sep. 5, 2023

(54) FIXING DEVICE FOR LINE LASER OUTPUT

(71) Applicant: MECH-MIND ROBOTICS TECHNOLOGIES LTD., Beijing (CN)

(72) Inventors: Xiao Wu, Beijing (CN); Youshuang Ding, Beijing (CN); Tianlan Shao, Beijing (CN)

(73) Assignee: MECH-MIND ROBOTICS TECHNOLOGIES LTD., Beijing (CN)

( * ) Notice: Subject to any disclaimer, the term of this patent is extended or adjusted under 35 U.S.C. 154(b) by 0 days.

(21) Appl. No.: 18/043,046

(22) PCT Filed: Sep. 15, 2020

(86) PCT No.: PCT/CN2020/115311
§ 371 (c)(1),
(2) Date: Feb. 27, 2023

(87) PCT Pub. No.: WO2022/041338
PCT Pub. Date: Mar. 3, 2022

(65) Prior Publication Data
US 2023/0246410 A1    Aug. 3, 2023

(30) Foreign Application Priority Data
Aug. 31, 2020 (CN) .......................... 202010893209.0

(51) Int. Cl.
*H01S 5/02253* (2021.01)
*H01S 5/02326* (2021.01)
(Continued)

(52) U.S. Cl.
CPC .......... *H01S 5/02253* (2021.01); *G02B 7/022* (2013.01); *G02B 7/1805* (2013.01); *G02B 27/0972* (2013.01); *H01S 5/02326* (2021.01)

(58) Field of Classification Search
CPC . H01S 5/02253; H01S 5/02326; G02B 7/022; G02B 7/1805; G02B 27/0972
See application file for complete search history.

(56) References Cited

U.S. PATENT DOCUMENTS

| 5,237,457 A | 8/1993 | Oono et al. |
| 2014/0085616 A1 | 3/2014 | Nackerud et al. |
| 2018/0263482 A1 | 9/2018 | Guan et al. |

FOREIGN PATENT DOCUMENTS

| CN | 1437001 A | 8/2003 |
| CN | 101477236 A | 7/2009 |

(Continued)

OTHER PUBLICATIONS

International Search Report dated Jun. 1, 2021 in International Application No. PCT/CN2020/115311. English translation attached.

(Continued)

*Primary Examiner* — James C. Jones

(57) ABSTRACT

Provided is a fixing device for line laser output. The device includes a laser beam expander having: a laser via hole defined in an axial direction thereof; an emitter embedding groove disposed at a laser entry end of the laser via hole, the emitter embedding groove having a peripheral wall coaxial with a peripheral wall of the laser via hole, and a bottom wall perpendicular to the peripheral wall of the laser via hole; and a Powell lens embedding groove disposed at a laser exit end of the laser via hole, the Powell lens embedding groove having a peripheral wall coaxial with the peripheral wall of the laser via hole, and a bottom wall perpendicular to the peripheral wall of the laser via hole.

11 Claims, 8 Drawing Sheets

(51) Int. Cl.
*G02B 7/02* (2021.01)
*G02B 7/18* (2021.01)
*G02B 27/09* (2006.01)

(56) References Cited

FOREIGN PATENT DOCUMENTS

| CN | 202486369 | U | | 10/2012 | |
|---|---|---|---|---|---|
| CN | 202975558 | U | | 6/2013 | |
| CN | 203433174 | U | | 2/2014 | |
| CN | 109739024 | A | | 5/2019 | |
| CN | 209256082 | U | | 8/2019 | |
| CN | 110488448 | | * | 11/2019 | ............. G02B 27/09 |
| CN | 110488448 | A | | 11/2019 | |
| CN | 209664594 | U | | 11/2019 | |
| CN | 110687687 | A | | 1/2020 | |
| CN | 210224582 | U | | 3/2020 | |

OTHER PUBLICATIONS

First Office Action from corresponding Chinese Application No. 202010893209.0, dated Mar. 30, 2021. English translation attached.
The Second Office Action from corresponding Chinese Application No. 202010893209.0, dated May 14, 2021. English translation attached.
The Grant Notice from corresponding Chinese Application No. 202010893209.0, dated Jun. 21, 2021. English translation attached.
First Office Action from corresponding Chinese Application No. 202110426227.2, dated Apr. 22, 2022. English translation attached.
The Second Office Action from corresponding Chinese Application No. 202110426227.2, dated Sep. 28, 2022. English translation attached.
First Office Action from corresponding Chinese Application No. 202110433898.1, dated Apr. 25, 2022. English translation attached.
The Second Office Action from corresponding Chinese Application No. 202110433898.1, dated Sep. 26, 2022. English translation attached.

* cited by examiner

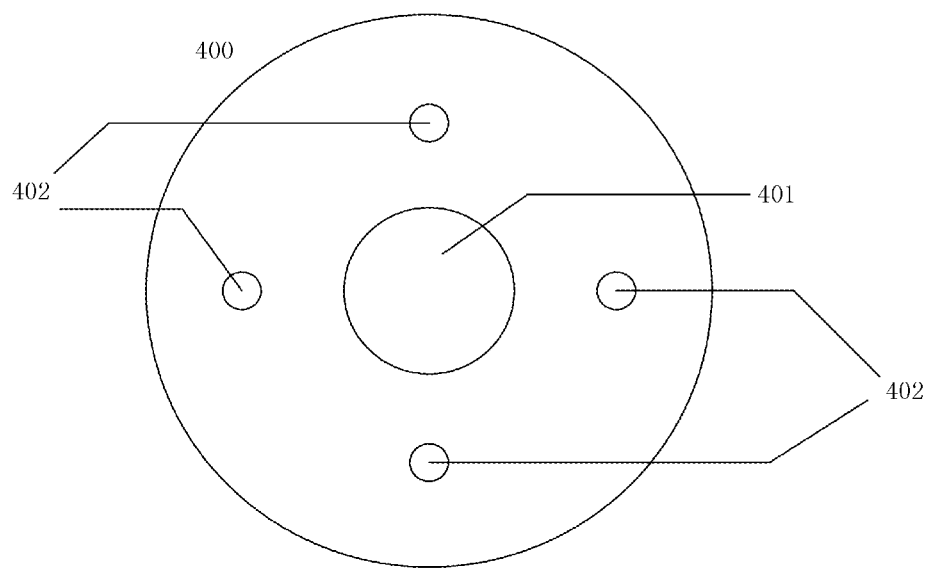
FIG. 5
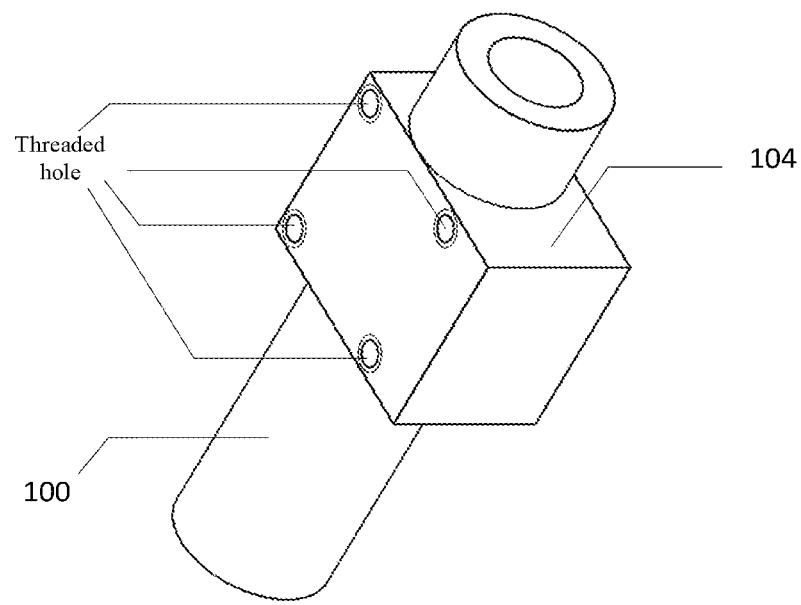
FIG. 6a(1)

FIG. 6a(2)

FIXING DEVICE FOR LINE LASER OUTPUT

FIELD

The present disclosure relates to the field of laser beam expanding technologies, and more particularly, to a fixing device for line laser output.

BACKGROUND

With the popularization of laser applications, application requirements of various fields on a laser are also gradually increased. For example, the laser is required to be output in a fixed shape, or the laser is required to carry energy greater than or equal to a certain value when projected to a plane. In the field of laser scanning imaging, the laser is required to be output in a straight-line-shaped line segment. In general, a laser beam is input to a Powell lens for shaping to output a straight-line-shaped laser, but it is difficult to align the laser beam with a center of the Powell lens, i.e., it is difficult to project the laser beam along an axis of the Powell lens. In the related art, a fixing device as illustrated in FIG. 1 is provided, which may implement the above alignment. FIG. 1a is a stereogram of the device, and FIG. 1b is a front view viewed from a side of the Powell lens. By adjusting tightness of jackscrews in adjusting holes 1 to 10, the device realizes large adjustments and fine adjustments of a pitch angle and a yaw angle of the Powell lens, to realize relative positional change of the Powell lens and a laser emitter, thereby realizing an alignment between the laser beam and the Powell lens. From an adjustment process of the device, an alignment manner thereof is complex and difficult to realize alignment. In addition, once the jackscrew falls off during subsequent use, a relative position of the laser beam relative to the lens will have a large deviation.

SUMMARY

The present disclosure aims to solve at least one of the technical problems in the related art to a certain extent.

To this end, the present disclosure provides a fixing device for line laser output, including: a laser beam expander. The laser beam expander has: a laser via hole defined in an axial direction thereof, the laser via hole being configured to allow a laser beam to pass therethrough; an emitter embedding groove disposed at a laser entry end of the laser via hole, the emitter embedding groove having a peripheral wall coaxial with a peripheral wall of the laser via hole, and a bottom wall perpendicular to the peripheral wall of the laser via hole, to enable an output port of a laser emitter to be aligned with the laser via hole to allow the laser beam to enter the laser via hole along an axis of the laser via hole; and a Powell lens embedding groove disposed at a laser exit end of the laser via hole, the Powell lens embedding groove having a peripheral wall coaxial with the peripheral wall of the laser via hole, and a bottom wall perpendicular to the peripheral wall of the laser via hole, to enable an axis of a Powell lens to coincide with the axis of the laser via hole when a non-cylindrical portion of the Powell lens is embedded into the Powell lens embedding groove.

Optionally, a fine thread is disposed on an inner peripheral wall of the laser via hole; and/or an inner diameter of a groove opening of the Powell lens embedding groove is greater than a diameter of a cylindrical portion of the Powell lens.

Optionally, the laser beam expander includes a prism fixing sleeve, the prism fixing sleeve has an end sleeved over the laser exit end of the laser via hole, and the Powell lens embedding groove is disposed on a surface of another end of the prism fixing sleeve, to enable rotation of the prism fixing sleeve in a circumferential direction relative to the laser exit end of the laser via hole; the prism fixing sleeve has two waist-shaped holes symmetrically formed in the circumferential direction on a circumference of a peripheral wall of the end sleeved over the laser exit end of the laser via hole, and at least three circular holes are evenly formed in the circumferential direction on a circumference of a peripheral wall of the laser exit end of the laser via hole that is in a same radial section as the circumference of the peripheral wall of the end sleeved over the laser exit end of the laser via hole, each of the two waist-shaped holes has a circumferential length greater than or equal to a numerical value corresponding to two of the at least three circular holes, the two waist-shaped holes cooperate with the at least three circular holes to achieve fastening of the prism fixing sleeve after the prism fixing sleeve rotates to any angle in the circumferential direction relative to the laser exit end of the laser via hole.

Optionally, a quantity of the circumference is two.

Optionally, a circular output port of the laser emitter is embedded in the emitter embedding groove, the emitter embedding groove has an internal thread disposed on an inner wall thereof, and the internal thread cooperates with a thread of an outer peripheral wall of the circular output port.

Optionally, the laser emitter is embedded in the emitter embedding groove, and the emitter embedding groove has fastening through holes extending in a radial direction of the emitter embedding groove and distributed on a peripheral wall of the emitter embedding groove. The fastening through holes are configured to cooperate with jackscrews to fasten the laser emitter, and the output port of the laser emitter extends into the laser via hole.

Optionally, according to the embodiments of the present disclosure, the fixing device further includes a laser adapter of a cylindrical structure and the laser adapter has: a port embedding hole defined in a center of the laser adapter, the port embedding hole penetrating the laser adapter in an axial direction of the laser adapter and having an inner diameter greater than a maximum radial size of the output port of the laser emitter; through holes distributed in an axial direction around the port embedding hole, the through holes matching with fixing grooves on the laser emitter to fix the laser emitter in cooperation with screws; and an external thread disposed on an outer peripheral wall of the laser adapter, the emitter embedding groove having an internal thread cooperating with the external thread of the laser adapter to embed and fix the laser adapter.

Optionally, the laser beam expander is nested in a fixing base, the fixing base is a rectangular fixing block, and the fixing device further includes: a steering fixing table having a table top surface that is divided into a beam expander fixing region and a galvanometer fixing region. The beam expander fixing region of the steering fixing table is fixed with the rectangular fixing block through an L-shaped adapter, and threaded holes and screws that are arranged respectively at corresponding positions of the beam expander fixing region, the L-shaped adapter, and the rectangular fixing block; and a galvanometer fixing hole penetrates the steering fixing table in the galvanometer fixing region in a direction perpendicular to the table top surface of the steering fixing table.

Optionally, the steering fixing table has a notch formed on a side edge opposite to a side of the galvanometer fixing region adjacent to the beam expander fixing region, wherein:

the notch penetrates the steering fixing table from the fixing galvanometer hole in a direction parallel to the table top surface of the steering fixing table, and further penetrates the steering fixing table in the direction perpendicular to the table top surface of the steering fixing table, to enable a peripheral wall of the galvanometer fixing hole to have deformation capability; and threaded through holes that match with each other are defined on two opposite surfaces of the notch, the threaded through holes penetrating the steering fixing table in a direction parallel to the table top surface of the steering fixing table and configured to cooperate with a screw to fasten a galvanometer in the galvanometer fixing hole.

Optionally, sawteeth are provided on an adjacent lateral edge of an edge of the steering fixing table penetrated by the notch, to increase the deformation capability of the peripheral wall of the galvanometer fixing hole.

According to the fixing device for line laser output provided by the embodiments of the present disclosure, the emitter embedding groove and the Powell lens embedding grooves are formed at two ends of the laser beam expander, and the laser emitter and the Powell lens are embedded into the laser beam expander, which realizes unified fixing of the laser emitter and the Powell lens. Therefore, compared with the related art, an alignment process of the laser beam with the Powell lens is simplified, and use efficiency is improved. In addition, the situation of deviation of the device during use in the related art is avoided.

In another aspect, the embodiments of the present disclosure further provide a 3D intelligent camera housing, including the fixing device corresponding to the above embodiments having the steering fixing table.

BRIEF DESCRIPTION OF DRAWINGS

The above and/or additional aspects and advantages of the present disclosure will become apparent and readily appreciated from the following description of the embodiments in conjunction with the accompanying drawings, in which:

FIG. 5 is a schematic structural diagram of a laser adapter according to some embodiments of the present disclosure;

FIG. 6a(1) is a schematic three-dimensional diagram of yet another structure of a laser beam expander according to some embodiments of the present disclosure;

FIG. 6a(2) is a schematic three-dimensional diagram of a fixing base according to some embodiments of the present disclosure;

Figure 1A:
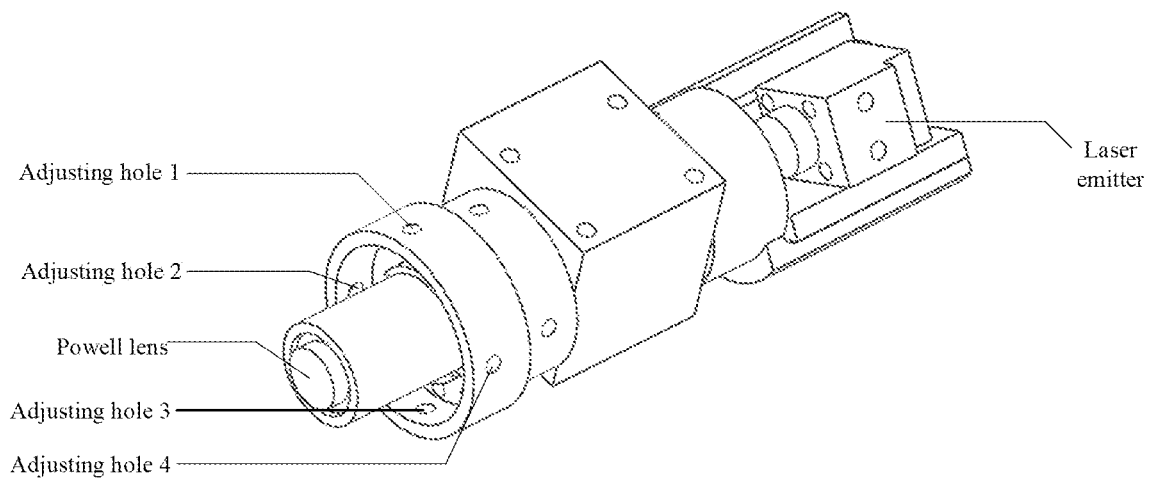
FIG. 1a and FIG. 1b are schematic structural diagrams according to an example of the related art.
Figure 1B:
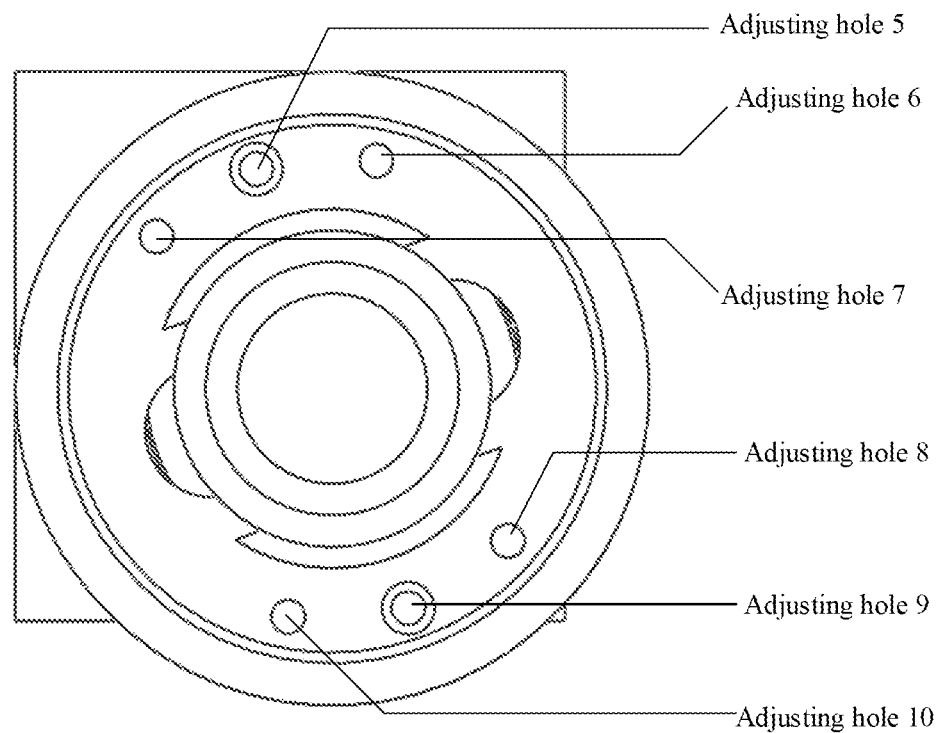

Reference Numerals:

laser beam expander 100; laser via hole 101; emitter embedding groove 102; Powell lens embedding groove 103; groove opening 1031; fixing base 104; prism fixing sleeve 105; waist-shaped hole 1051; circular hole 106; laser emitter 200; Powell lens 300; cylindrical portion 301; non-cylindrical portion 302; roof ridge 303; laser adapter 400; port embedding hole 401; through hole 402; steering fixing table 500; beam expander fixing region 501; galvanometer fixing region 502; L-shaped adapter 503; galvanometer fixing hole 504; notch 505; threaded through hole 506; sawtooth 507.

DESCRIPTION OF EMBODIMENTS

Embodiments of the present disclosure will be described in detail below, and examples of the embodiments are illustrated in the accompanying drawings, throughout which same or similar reference numerals refer to the same or similar elements or elements having the same or similar functions. The embodiments described below with reference to the accompanying drawings are illustrative and intended to explain the present disclosure and should not be construed as limiting the present disclosure.

A fixing device for line laser output provided by embodiments of the present disclosure will be described below with reference to the drawings.

Figure 2:
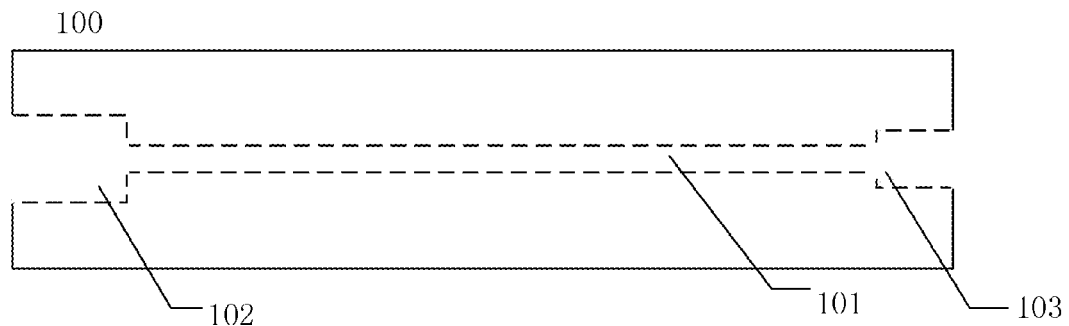
FIG. 2 is a schematic sectional diagram of a structure of a laser beam expander according to some embodiments of the present disclosure.
Figure 3A:
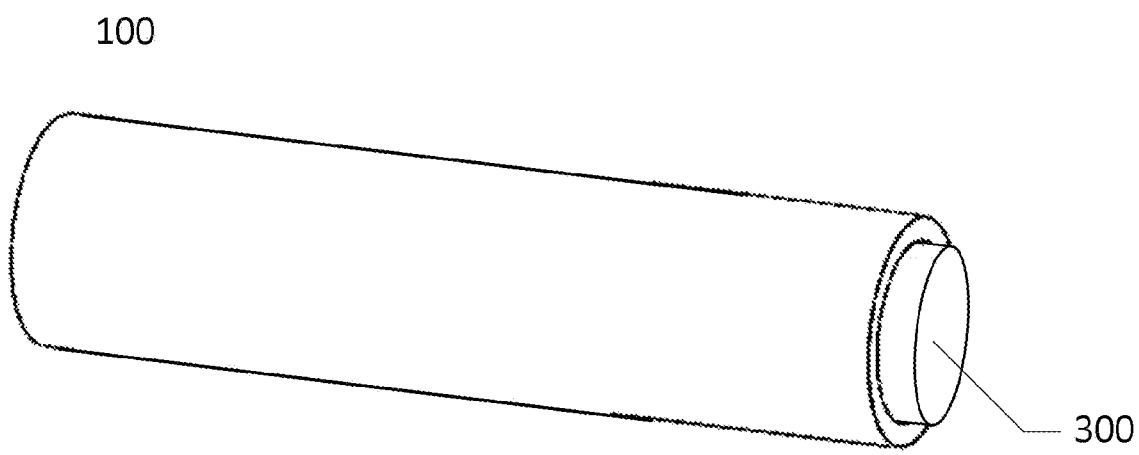
FIG. 3a is a schematic three-dimensional diagram of a structure of a laser beam expander according to some embodiments of the present disclosure.
Figure 3B:
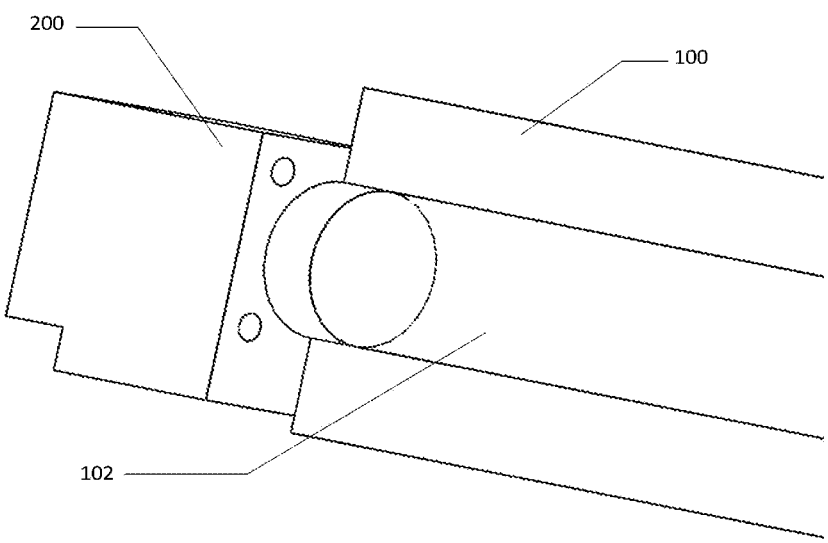
FIG. 3b is a schematic diagram of a laser emitter embedded in a laser beam expander according to some embodiments of the present disclosure.

As illustrated in FIG. 2 and FIG. 3, in some embodiments, the present disclosure provides a fixing device including a laser beam expander 100. The laser beam expander 100 has: a laser via hole 101 defined in an axial direction thereof; an emitter embedding groove 102 disposed at a laser entry end of the laser via hole 101; and a Powell lens embedding groove 103 disposed at a laser exit end of the laser via hole 101. The laser via hole 101 is configured to allow a laser beam to pass therethrough. The emitter embedding groove 102 has a peripheral wall coaxial with a peripheral wall of the laser via hole 101, and a bottom wall perpendicular to the peripheral wall of the laser via hole 101, to enable an output port of a laser emitter 200 to be aligned with the laser via hole 101 to allow the laser beam to enter the laser via hole 101 along an axis of the laser via hole 101. The Powell lens embedding groove 103 has a peripheral wall coaxial with the peripheral wall of the laser via hole 101, and a bottom wall perpendicular to the peripheral wall of the laser via hole 101, to enable an axis of a Powell lens 300 to coincide with the axis of the laser via hole 101 when a non-cylindrical portion 302 of the Powell lens 300 is embedded into the Powell lens embedding groove 103.

It can be understood by those skilled in the art that, in some embodiments, a shape and a size of a radial section of the mentioned embedding groove match with a radial section of a portion to be embedded of a corresponding component. In this way, the fixing of the corresponding component in the embedding groove can be realized through a friction effect between the peripheral wall of the embedding groove and an outer peripheral wall of the corresponding component or by filling a seal in the groove opening of the embedding groove.

In actual use, the laser emitter 200 is embedded into the emitter embedding groove 102, and the Powell lens 300 is embedded into the Powell lens embedding groove 103. Because of the positional relationship between the emitter embedding groove 102 and the laser via hole 101 and the positional relationship between the Powell lens embedding groove 103 and the laser via hole 101, when the laser emitter 200 emits a laser beam, the laser beam can enter the laser via hole 101 along the axis of the laser via hole 101 and is projected to the Powell lens 300 along an axis of the Powell lens 300 at the same time when exiting from the laser via hole 101. In this way, a line laser capable of satisfying use requirements can be outputted through the principle of a light beam shaping of the Powell lens 300.

According to the fixing device for line laser output provided by the embodiments of the present disclosure, the emitter embedding groove and the Powell lens embedding groove are formed at two ends of the laser beam expander, and the laser emitter and the Powell lens are embedded into the laser beam expander, which realizes unified fixing of the laser emitter and the Powell lens. Compared with the related art, an alignment process of the laser beam with the Powell lens is simplified, and use efficiency is improved. In addition, the situation of deviation of the device during use in the related art is avoided.

In some embodiments, the laser beam expander 100 includes a prism fixing sleeve 105. The prism fixing sleeve 105 has an end sleeved over the laser exit end of the laser via hole 101, and the Powell lens embedding groove 103 is disposed on a surface of another end of the prism fixing sleeve 105, to enable rotation of the prism fixing sleeve 105 in a circumferential direction relative to the laser exit end of the laser via hole 101. Therefore, it is convenient for adjustment, and enables a uniform and symmetrical shape of the outputted line laser to satisfy application requirements.

Figure 7A:
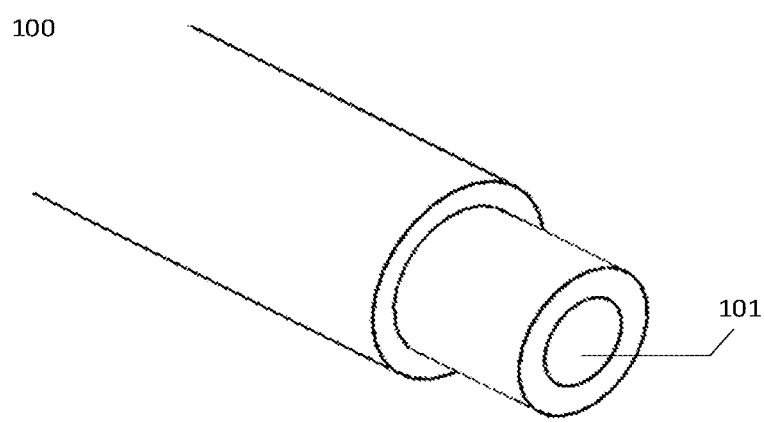
FIG. 7a and FIG. 7b are schematic three-dimensional diagrams of some other structures of a laser beam expander according to some embodiments of the present disclosure.

In some optional embodiments, an outer diameter of a sleeve joint of the laser beam expander 100 where the prism fixing sleeve 105 is to be sleeved is smaller than the rest of the laser beam expander 100, optionally as illustrated in FIG. 7a, and the sleeve joint where the prism fixing sleeve 105 (not shown in FIG. 7, but shown in FIG. 8) has been sleeved has the same radial size as the rest of the laser beam expander 100. Certainly, in some other optional embodiments, the above-mentioned sleeve joint does not necessarily have the form shown in FIG. 7a, and the outer diameter thereof is not necessarily smaller than the rest of the laser beam expander 100.

Figure 7B:
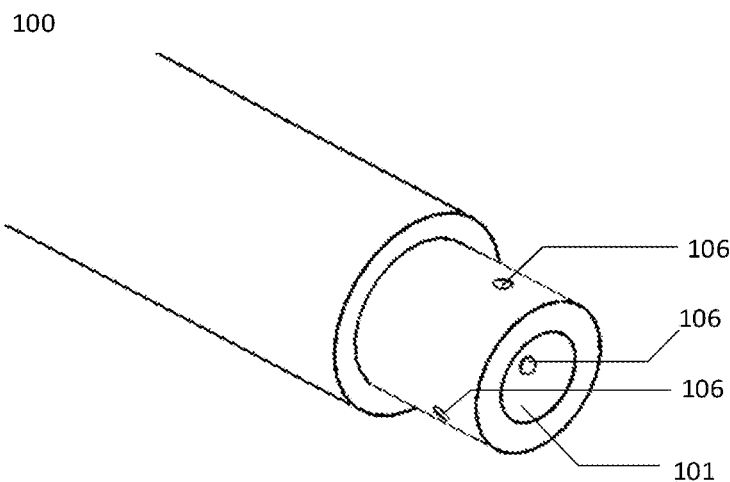
Figure 8A:
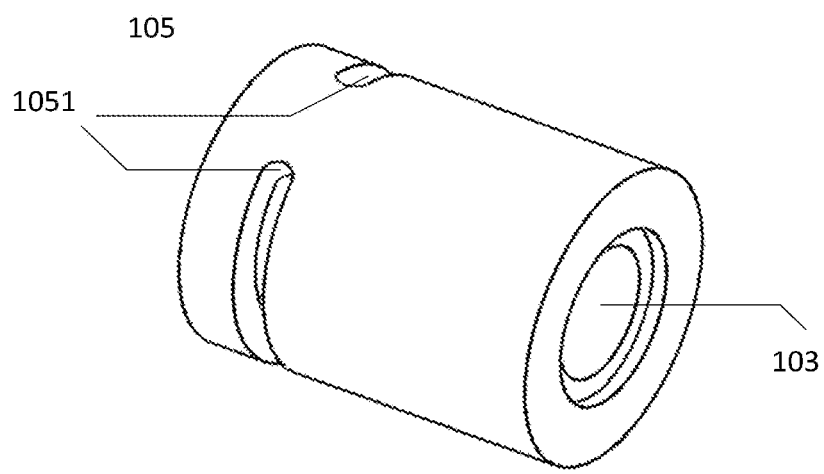
FIG. 8a to FIG. 8c are schematic structural diagrams of a prism fixing sleeve according to some embodiments of the present disclosure.
Figure 8B:
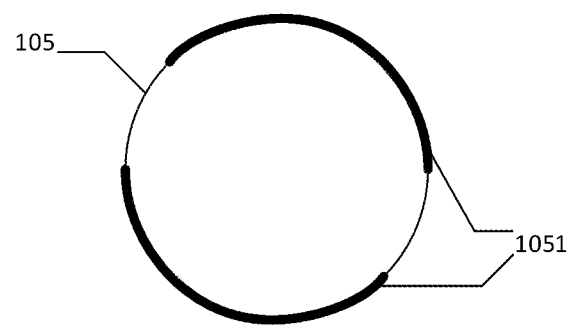

In some embodiments, as illustrated in FIG. 8a, the prism fixing sleeve 105 has two waist-shaped holes 1051 symmetrically formed in the circumferential direction on a circumference of a peripheral wall of the end sleeved over the laser exit end of the laser via hole 101 (not shown in FIG. 8, but can be seen in FIG. 7). FIG. 8b is a schematic diagram of a radial section of the prism fixing sleeve 105, and illustrates positions of the two waist-shaped holes 1051 that are symmetrical in the circumferential direction according to some embodiments of the present disclosure. In some embodiments, as illustrated in FIG. 7b, at least three circular holes 106 are evenly formed in the circumferential direction on a circumference of a peripheral wall of the laser exit end of the laser via hole 101 that is in a same radial section as the previously mentioned circumference. In some embodiments, each of the two waist-shaped holes 1051 has a circumferential length greater than or equal to a numerical value corresponding to two of the at least three circular holes 106. That is, when the prism fixing sleeve 105 is sleeved over the laser exit end of the laser via hole 101, a length of each of the two waist-shaped holes 1051 at least accommodates two circular holes 106, and the waist-shaped holes 1051 cooperate with the circular holes 106 to fasten the prism fixing sleeve 105 after the prism fixing sleeve 105 rotates to any angle in the circumferential direction relative to the laser exit end of the laser via hole 101.

Figure 9A:
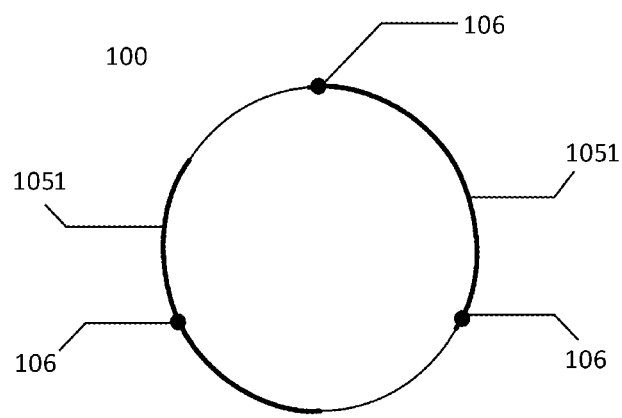
FIG. 9a and FIG. 9b are schematic diagrams of a positional relationship between waist-shaped holes and circular holes according to some embodiments of the present disclosure.
Figure 9B:
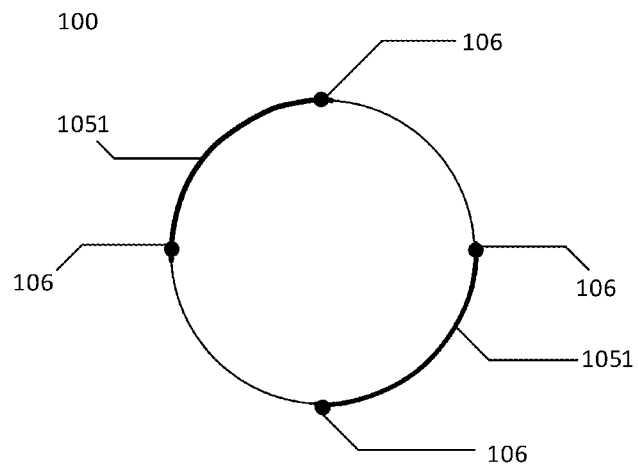

In some embodiments, a quantity of the circular holes 106 can be three, and a relatively positional relationship between the circular holes 106 and the waist-shaped holes 1051 can be shown in FIG. 9a; or the quantity of the circular holes 106 can be four, and the relatively positional relationship between the circular holes 106 and the waist-shaped holes 1051 can be shown in FIG. 9b. Certainly, the quantity of the circular holes can be larger.

Figure 8C:
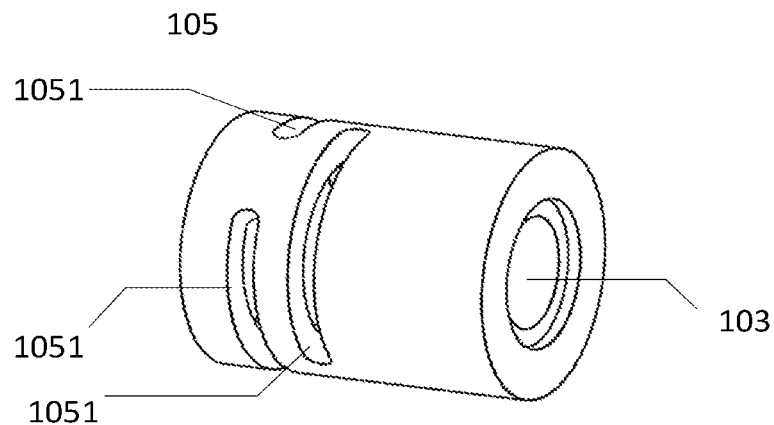

In some optional embodiments, a quantity of the circumference is two. According to the above embodiments, the circular holes 106 and the waist-shaped holes 1051 are respectively arranged in a matched manner in circumferences in a same radial section of the corresponding component thereof. In some preferred embodiments, the quantity of the circumference can be two. That is, two circumferences of the prism fixing sleeve 105 are each provided with two waist-shaped holes 106, and two corresponding circumferences of the laser exit end of the laser via hole 101 are provided with corresponding circular holes 106 in cooperation with the two waist-shaped holes 106, which enables firmer fastening between the prism fixing sleeve 105 and the laser exit end of the laser via hole 101. As illustrated in FIG. 8c, the two circumferences of the prism fixing sleeve 105 each have two waist-shaped holes 106 disposed therein.

In some optional embodiments, a shape of the laser beam expander 100 may be a circular cylinder, a square cylinder, a cylinder having a polygonal radial section, or the like, which is not specifically limited in the embodiments of the present disclosure. A size of the laser beam expander 100 may be set according to specific usage requirements, provided that the emitter embedding groove 102 and the Powell lens embedding groove 103 can be accommodated. For example, when a maximum radial size of the emitter embedding groove 102 is greater than a maximum radial size of the Powell lens embedding groove 103, a radial size of the laser beam expander 100 is required to be greater than the maximum radial size of the emitter embedding groove 102; otherwise, the radial size of the laser beam expander 100 is required to be greater than the maximum radial size of the Powell lens embedding groove 103. As another example, an axial size of the laser beam expander 100 is greater than a sum of groove depths of the emitter embedding groove 102 and the Powell lens embedding groove 103.

In some optional embodiments, a radial section of the laser via hole 101 may be circular, square, or in other shapes. In the preferred embodiments, a shape of the radial section of the laser via hole 101 matches with a shape of a radial section of the output port of the laser emitter 200. Optionally, for a size of the laser via hole 101, a size of the radial section of the laser via hole 101 is greater than or equal to a size of the radial section of the output port of the laser emitter 200, and an axial length of the laser via hole 101 may be specifically determined based on a distance between a focal plane of a laser beam outputted by the laser emitter 200 and an end surface of the output port of the laser emitter 200.

It should be noted that the output port of the laser emitter 200 mentioned in some embodiments is an end portion of the laser transmitter 200 from which a laser is outputted.

In some optional embodiments, an extinction fringe is disposed on an inner peripheral wall of the laser via hole 101 for ensuring high-quality transmission of the laser beam in the laser via hole 101. Optionally, the extinction fringe is a fine thread.

Figure 4A:
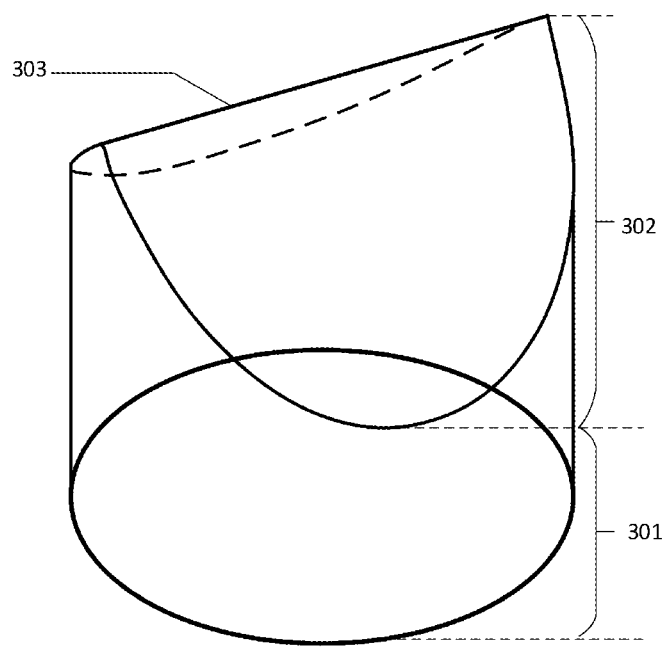
FIG. 4a is a schematic structural diagram of a Powell lens.

It can be understood by those skilled in the art that, in some embodiments of the present disclosure, the Powell lens 300 has a structure as shown in FIG. 4a, and includes a cylindrical portion 301, a non-cylindrical portion 302, and a roof ridge 303. In some embodiments of the present disclosure, the non-cylindrical portion 302 is embedded into the Powell lens embedding groove 103 for laser shaping during use, and the cylindrical portion 301 is exposed (some may be completely exposed, and others may be partially exposed) outside the Powell lens embedding groove 103 for facilitating rotating the Powell lens 300 in a radial direction and adjusting the roof ridge 303 by rotation to output a line laser having an optimal shape. It should be noted that, in some embodiments, when it mentions that the non-cylindrical portion 302 is embedded into the Powell lens embedding groove 103, it emphasizes that it is necessary to ensure that the non-cylindrical portion 302 is completely embedded into the Powell lens embedding groove 103, rather than indicating that other portions of the Powell lens 300 are not in the Powell lens embedding groove 103. Specifically, the cylindrical portion 301 of the Powell lens 300 may be partially embedded into the Powell lens embedding groove 103, so that the Powell lens 300 can be conveniently fixed in the Powell lens embedding groove 103.

Figure 4B:
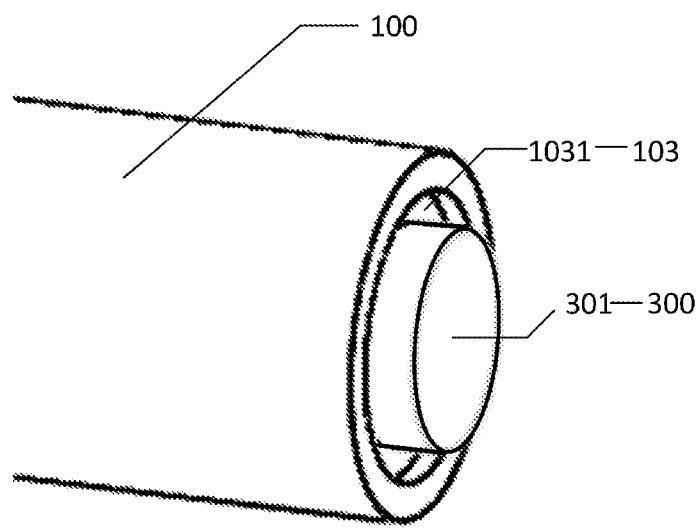
FIG. 4b is a schematic three-dimensional diagram of another structure of a laser beam expander according to some embodiments of the present disclosure.

For some embodiments in which the cylindrical portion 301 is exposed outside, in some optional embodiments of the present disclosure, as illustrated in FIG. 4b, an inner diameter of a groove opening 1031 of the Powell lens embedding groove 103 is greater than a diameter of the cylindrical portion 301 of the Powell lens 300. Therefore, during actual use, a colloid can be filled in the groove opening 1031 to fix the Powell lens 300 in the Powell lens embedding groove 103. In some preferred embodiments, a degree to which the inner diameter of the groove opening 1031 is greater than the diameter of the cylindrical portion 301 should not be too large, provided that a better effect can be realized by a person skilled in the art.

It can be understood by those skilled in the art that the laser emitter during actual use has a plurality of models. Therefore, in some optional embodiments, a shape and size of the emitter embedding groove 102 can be set according to shapes and sizes of laser emitters in different models, to be completely embedded into the corresponding laser emitter 200. In some preferred embodiments, the emitter embedding groove 102 has fastening through holes extending in a radial direction of the emitter embedding groove 102 and distributed on a peripheral wall of the emitter embedding groove 102, to cooperate with jackscrews to fasten the laser emitter 200, and the output port of the laser emitter 200 extends into the laser via hole 101.

In actual use, there is a case that the output port of the laser emitter 200 is circular, and an external thread is disposed on an outer peripheral wall of the circular output port. In this case, in some preferred embodiments of the present disclosure, the circular output port of the laser emitter 200 is embedded into the emitter embedding groove 102, and an internal thread is disposed on an inner wall of the emitter embedding groove 102 and is tightly engaged with the thread on the outer peripheral wall of the circular output port, which enables rotation of the laser emitter 200 and the laser beam expander 100 in the circumferential direction under cooperation of outer and internal threads, to output the line laser with the shape satisfying the use requirements. Optionally, when the laser emitter 200 and the laser beam expander 100 rotate to a better state, fastening between the laser emitter 200 and the laser beam expander 100 may be achieved by a threaded hole formed in the peripheral wall of the emitter embedding groove 102 in the radial direction and cooperating with a screw.

In another actual situation, there may be a case in which the laser emitter 200 cannot match with the emitter embedding groove 102. In some embodiments of the present disclosure, the provided fixing device further includes: a laser adapter 400 that is of a cylindrical structure. FIG. 5 shows a radial cross-sectional view of the laser adapter 400. The laser adapter 400 has: a port embedding hole 401 disposed in a center of the laser adapter 400, and the port embedding hole 401 penetrates the laser adapter 400 in an axial direction of the laser adapter 400 and has an inner diameter greater than a maximum radial size of the output port of the laser emitter 200. The laser adapter 400 has through holes 402 distributed in an axial direction around the port embedding hole 401, and the through holes 402 match with fixing grooves on the laser emitter 200 to fix the laser emitter 200 in cooperation with screws. An external thread is disposed on an outer peripheral wall of the laser adapter 400. The emitter embedding groove 102 having an internal thread cooperating with the external thread of the laser adapter 400 to embed and fix the laser adapter 400.

In some embodiments of the present disclosure, the laser beam expander 100 is nested in a fixing base 104, which facilitates the fixing of the laser beam expander 100.

In some embodiments of the present disclosure, the fixing base 104 may be a rectangular fixing block. In some preferred embodiments, the laser beam expander 100 is nested in the rectangular fixing block in a direction parallel to a side of the rectangular fixing block, i.e., the axis of the laser beam expander 100 is parallel to the side of the rectangular block. Optionally, as illustrated in FIG. 6a(1), the side may be specifically any one of a "length" side, a "width" side, or a "height" side of the rectangular block. It can be understood by those skilled in the art that a position in the rectangular fixing block 104 where the laser beam expander 100 is nested may be biased towards a surface of the rectangular block, as illustrated in FIG. 6a(1), or may be a centered position, which can be specifically set according to actual use requirements.

In some other embodiments, the fixing base 104 may be in an irregular shape. For example, a portion of the fixing base 104 in which the laser beam expander 100 is nested is cylindrical, and a portion that achieves a function of fixing the laser beam expander 100 with a target flat surface is attached to the target flat surface, for example, as illustrated in FIG. 6a(2).

Figure 6B:
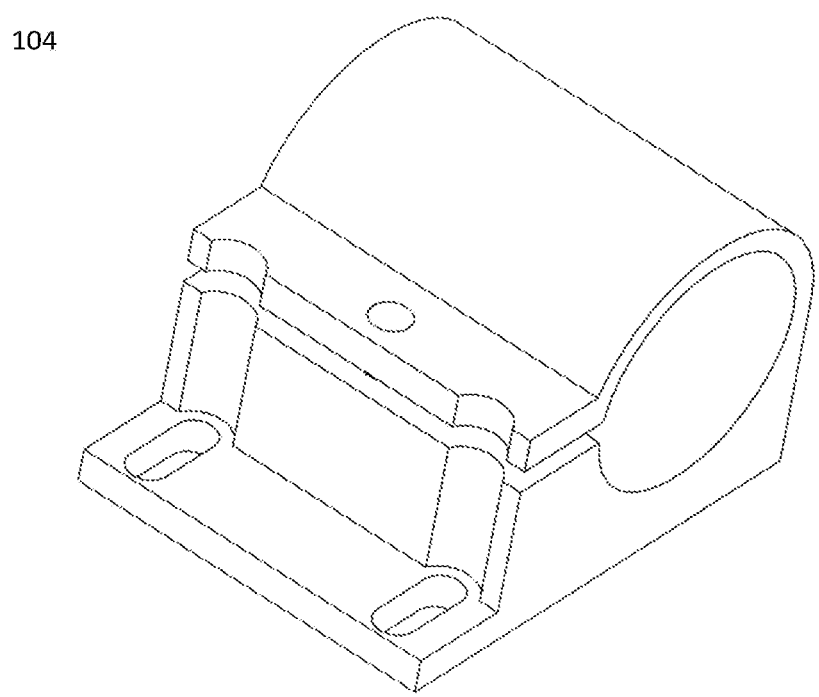
FIG. 6b is a schematic structural diagram of a steering fixing table according to some embodiments of the present disclosure.
Figure 6B:
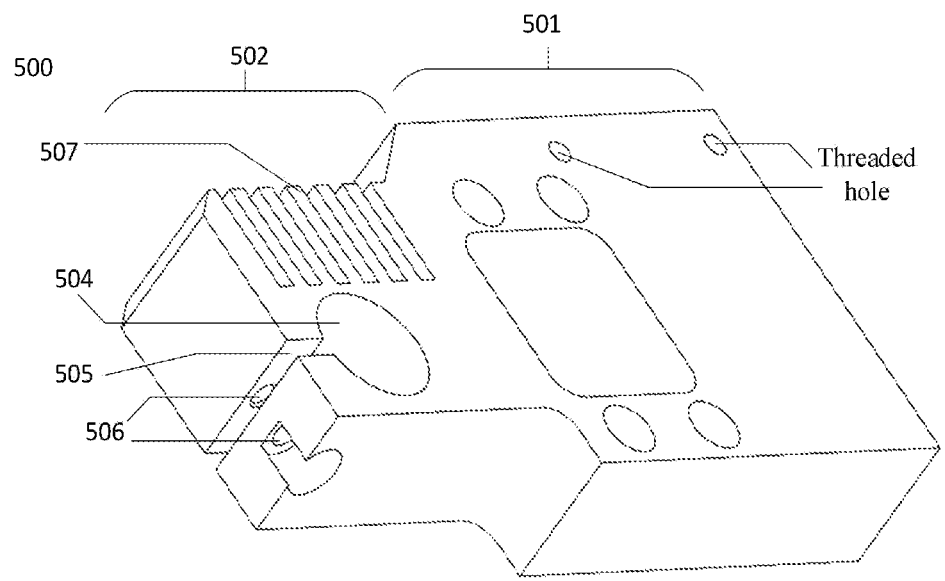

In some embodiments, according to the embodiments of the present disclosure, the fixing device further includes a steering fixing table 500 having a table top surface that is divided into a beam expander fixing region 501 and a galvanometer fixing region 502. In some embodiments, the steering fixing table 500 may be presented as a rectangular flat block or an irregular-shaped flat block as shown in FIG. 6b. In actual use, the laser beam expander 100 is fixed at the beam expander fixing region 501 of the steering fixing table 500, and a galvanometer is fixed at the galvanometer fixing region 502. Therefore, the line laser outputted by the laser beam expander 100 can be reflected by the galvanometer and cooperate with the galvanometer to oscillate, and the fixing device provided by the embodiments of the present disclosure can output a movable line laser. In some embodiments, a size of the beam expander fixing region 501 of the steering fixing table 500 may be set according to the radial size and the axial size of the laser beam expander 100, and a size of the galvanometer fixing region 502 may be set according to a radial size of a motor of a galvanometer.

Figure 6C:
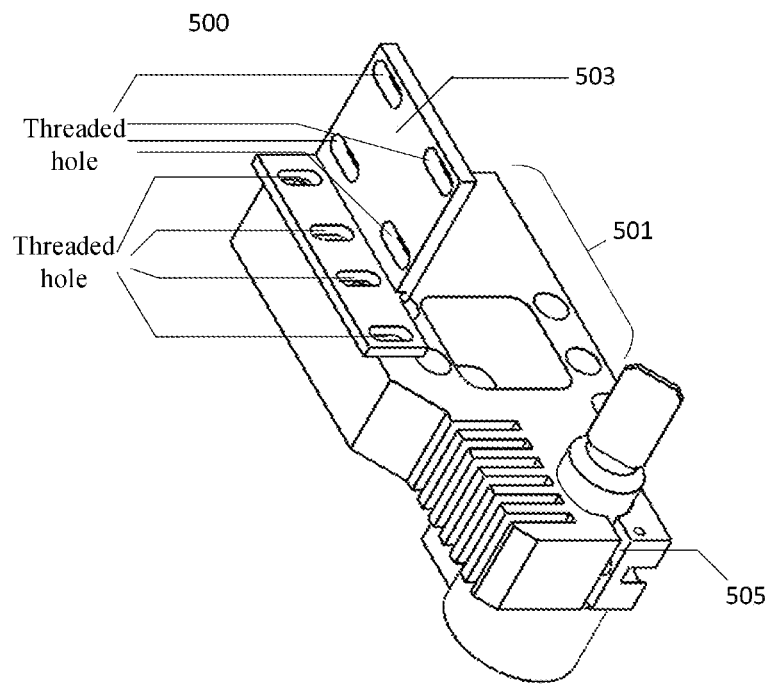
FIG. 6c is a schematic structural diagram of a combination of a steering fixing table and an L-shaped adapter according to some embodiments of the present disclosure.

In some embodiments, the beam expander fixing region 501 of the steering fixing table 500 is fixed with the rectangular fixing block 104 through an L-shaped adapter 503, and threaded holes and/or threaded grooves that are arranged respectively at corresponding positions of the beam expander fixing region 501, the L-shaped adapter 503, and the rectangular fixing block 104 and cooperate with screws; and a galvanometer fixing hole 504 penetrates the steering fixing table 500 in the galvanometer fixing region 502 in a direction perpendicular to the table top surface of the steering fixing table 500. As illustrated in FIG. 6c, the L-shaped adapter 503 is in an "L" shape when viewed from one perspective, which is actually configured as two rigid flat surface perpendicular to each other. One flat surface is in contact with the beam expander fixing region 501 of the steering fixing table 500 and is fixed through cooperation of threaded holes and screws; and the other flat surface is in contact with a surface of the fixing base 104 (not shown in FIG. 6c, but can be seen in FIG. 6a(1) or FIG. 6a(2)) and fixed by the cooperation of threaded holes and screws. Further, the L-shaped adapter 503 can fix the laser beam expander 100 in the beam expander fixing region 501 of the steering fixing table 500.

In some embodiments, as illustrated in FIG. 6b, the steering fixing table 500 has a notch 505 formed on a side edge opposite to a side of the galvanometer fixing region 502 adjacent to the beam expander fixing region 501. The notch 505 penetrates the steering fixing table 500 from the fixing galvanometer hole 504 in a direction parallel to the table top surface of the steering fixing table 500, and further penetrates the steering fixing table 500 in a direction perpendicular to the table top surface of the steering fixing table 500, to enable a peripheral wall of the galvanometer fixing hole 504 to have deformation capability. Threaded through holes 506 that match with each other are defined on two opposite surfaces of the notch 505. The threaded through holes 506 penetrates the steering fixing table 500 in a direction parallel to the table top surface of the steering fixing table 500 and is configured to cooperate with a screw to achieve fastening of a galvanometer in the galvanometer fixing hole 504.

It can be understood by those skilled in the art that, in some embodiments, when an area of the galvanometer fixing region 502 is excessively greater than a radial area of the galvanometer fixing hole 504, the peripheral wall of the galvanometer fixing hole 504 is too thick, which is not conducive to the fastening of the galvanometer therein. Therefore, in some optional embodiments, as illustrated in FIG. 6b, sawteeth 507 are provided on an adjacent lateral edge of an edge of the steering fixing table 500 penetrated by the notch 505, to reduce the stress of the corresponding edge of the steering fixing table 500 to further increase the deformation capability of the peripheral wall of the galvanometer fixing hole 504 connected to the corresponding edge.

In another aspect, the embodiments of the present disclosure further provide a 3D intelligent camera housing in which the fixing device corresponding to any aforementioned embodiment including the steering fixing table 500 is fixed.

Reference throughout this specification, description with reference to the phrase "an embodiment", "some embodiments", "an example", "a specific example", or "some examples" means that a particular feature, structure, material, or characteristic described in connection with the embodiment or example is included in at least one embodiment or example of the present disclosure. The appearances of the above phrases in various places throughout this specification are not necessarily referring to the same embodiment or example of the present disclosure. Furthermore, the particular features, structures, materials, or characteristics described may be combined in any suitable manner in one or more embodiments or examples. In addition, different embodiments or examples and features of different embodiments or examples described in the specification may be combined by those skilled in the art without mutual contradiction.

Although the configurations of embodiments of the present disclosure have been shown and described, it would be appreciated by those skilled in the art that the above embodiments are exemplary and cannot be construed as limiting the present disclosure, and changes, modifications, substitutions, and variations can be made by those skilled in the art to the embodiments without departing from the scope of the present disclosure.

What is claimed is:

1. A fixing device for line laser output, comprising a laser beam expander, the laser beam expander having:
    a laser via hole defined in an axial direction thereof, the laser via hole being configured to allow a laser beam to pass therethrough;
    an emitter embedding groove disposed at a laser entry end of the laser via hole, a laser emitter is to be embedded in the emitter embedding groove, the emitter embedding groove having a peripheral wall coaxial with a peripheral wall of the laser via hole, and a bottom wall perpendicular to the peripheral wall of the laser via hole, to enable an output port of the laser emitter to be aligned with the laser via hole to allow the laser beam to enter the laser via hole along an axis of the laser via hole; and
    a Powell lens embedding groove disposed at a laser exit end of the laser via hole, the Powell lens embedding groove having a peripheral wall coaxial with the peripheral wall of the laser via hole, and a bottom wall perpendicular to the peripheral wall of the laser via hole, to enable an axis of a Powell lens to coincide with the axis of the laser via hole when a non-cylindrical portion of the Powell lens is embedded into the Powell lens embedding groove,
    wherein the laser beam expander comprises a prism fixing sleeve, wherein:
    the prism fixing sleeve has an end sleeved over the laser exit end of the laser via hole, and the Powell lens embedding groove is disposed on a surface of another end of the prism fixing sleeve, to enable rotation of the prism fixing sleeve in a circumferential direction relative to the laser exit end of the laser via hole;
    the prism fixing sleeve has two waist-shaped holes symmetrically formed in the circumferential direction on a circumference of a peripheral wall of the end sleeved over the laser exit end of the laser via hole;
    at least three circular holes are evenly formed in the circumferential direction on a circumference of a peripheral wall of the laser exit end of the laser via hole that is in a same radial section as the circumference of the peripheral wall of the end sleeved over the laser exit end of the laser via hole;

each of the two waist-shaped holes has a circumferential length greater than or equal to a numerical value corresponding to two of the at least three circular holes; and the two waist-shaped holes cooperate with the at least three circular holes to achieve fastening of the prism fixing sleeve after the prism fixing sleeve rotates to any angle in the circumferential direction relative to the laser exit end of the laser via hole.

2. The device according to claim 1, wherein a fine thread is disposed on an inner peripheral wall of the laser via hole; and/or an inner diameter of a groove opening of the Powell lens embedding groove is greater than a diameter of a cylindrical portion of the Powell lens.

3. The device according to claim [[3]]1, wherein a quantity of the circumference is two.

4. The device according to claim 1, wherein a circular output port of the laser emitter is embedded in the emitter embedding groove, and the emitter embedding groove has an internal thread disposed on an inner wall thereof and engaged with a thread of an outer peripheral wall of the circular output port; or the laser emitter is embedded in the emitter embedding groove, and the emitter embedding groove has fastening through holes extending in a radial direction of the emitter embedding groove and distributed on a peripheral wall of the emitter embedding groove, the fastening through holes being configured to cooperate with jackscrews to fasten the laser emitter, the output port of the laser emitter extending into the laser via hole.

5. The device according to claim 1, further comprising a laser adapter of a cylindrical structure, the laser adapter having:

a port embedding hole defined in a center of the laser adapter, the port embedding hole penetrating the laser adapter in an axial direction of the laser adapter and having an inner diameter greater than a maximum radial size of the output port of the laser emitter;

through holes distributed in an axial direction around the port embedding hole, the through holes matching with fixing grooves on the laser emitter to fix the laser emitter in cooperation with screws; and an external thread disposed on an outer peripheral wall of the laser adapter, the emitter embedding groove having an internal thread cooperating with the external thread of the laser adapter to embed and fix the laser adapter.

6. The device according to claim 1, wherein the laser beam expander is nested in a fixing base, the fixing base is a rectangular fixing block, and the fixing device further comprises: a steering fixing table having a table top surface that is divided into a beam expander fixing region and a galvanometer fixing region, wherein:

the beam expander fixing region of the steering fixing table is fixed with the rectangular fixing block through an L-shaped adapter, and threaded holes and screws that are arranged respectively at corresponding positions of the beam expander fixing region, the L-shaped adapter, and the rectangular fixing block; and a galvanometer fixing hole penetrates the steering fixing table in the galvanometer fixing region in a direction perpendicular to the table top surface of the steering fixing table.

7. The device according to claim 6, wherein the steering fixing table has a notch formed on a side edge opposite to a side of the galvanometer fixing region adjacent to the beam expander fixing region, wherein:

the notch penetrates the steering fixing table from the fixing galvanometer hole in a direction parallel to the table top surface of the steering fixing table, and further penetrates the steering fixing table in the direction perpendicular to the table top surface of the steering fixing table, to enable a peripheral wall of the galvanometer fixing hole to have deformation capability; and threaded through holes that match with each other are defined on two opposite surfaces of the notch, the threaded through holes penetrating the steering fixing table in a direction parallel to the table top surface of the steering fixing table and configured to cooperate with a screw to fasten a galvanometer in the galvanometer fixing hole.

8. The device according to claim 7, wherein sawteeth are provided on an adjacent lateral edge of an edge of the steering fixing table penetrated by the notch, to increase the deformation capability of the peripheral wall of the galvanometer fixing hole.

9. A 3D intelligent camera housing, comprising the fixing device according to claim 6.

10. The 3D intelligent camera housing according to claim 9, wherein the steering fixing table has a notch formed on a side edge opposite to a side of the galvanometer fixing region adjacent to the beam expander fixing region, wherein:

the notch penetrates the steering fixing table from the fixing galvanometer hole in a direction parallel to the table top surface of the steering fixing table, and further penetrates the steering fixing table in the direction perpendicular to the table top surface of the steering fixing table, to enable a peripheral wall of the galvanometer fixing hole to have deformation capability; and threaded through holes that match with each other are defined on two opposite surfaces of the notch, the threaded through holes penetrating the steering fixing table in a direction parallel to the table top surface of the steering fixing table and configured to cooperate with a screw to fasten a galvanometer in the galvanometer fixing hole.

11. The 3D intelligent camera housing according to claim 10, wherein sawteeth are provided on an adjacent lateral edge of an edge of the steering fixing table penetrated by the notch, to increase the deformation capability of the peripheral wall of the galvanometer fixing hole.

* * * * *